United States Patent [19]
Brown et al.

[11] Patent Number: 6,005,430
[45] Date of Patent: Dec. 21, 1999

[54] CLOCK SKEW CIRCUIT

[75] Inventors: Brian L. Brown; David R. Brown, both of Sugar Land, Tex.

[73] Assignee: Texas Instruments Incorporated, Dallas, Tex.

[21] Appl. No.: 09/030,148

[22] Filed: Feb. 25, 1998

Related U.S. Application Data

[60] Provisional application No. 60/038,532, Feb. 28, 1997.

[51] Int. Cl.[6] .................................................. H03H 11/26
[52] U.S. Cl. ........................................... 327/277; 327/284
[58] Field of Search ..................................... 327/161, 292, 327/262, 276, 277, 155, 159, 269, 270, 271, 272, 278, 284, 285, 288, 291; 326/93

[56] References Cited

U.S. PATENT DOCUMENTS

| 5,394,024 | 2/1995 | Buckenmaier et al. | 327/160 |
| 5,467,464 | 11/1995 | Oprescu et al. | 395/551 |
| 5,767,720 | 6/1998 | Osera et al. | 327/295 |

*Primary Examiner*—Toan Tran
*Assistant Examiner*—Anh-Quan Tra
*Attorney, Agent, or Firm*—Ronald O. Neerings; Michael K. Skrehot; Richard L. Donaldson

[57] ABSTRACT

A clock circuit including a first delay circuit comprising an input terminal and a series of logic circuits, each of the logic circuits including an output terminal and first and second input terminals. The input terminal is coupled to the first input terminal of a first logic circuit in the series and the output of the first logic circuit is coupled to the second input terminal of a second logic circuit in the series. The output of the second logic circuit is coupled to the first input terminal of a third logic circuit in the series, and subsequent logic circuits in the series have alternately the first or second input terminal coupled to the output terminal of an immediately preceding logic circuit in the series. The circuit also includes a second delay circuit comprising an output terminal and a series of logic circuits, each of the logic circuits including an output terminal and first and second input terminals. The output terminal of the first logic circuit in the series is coupled to the second input terminal of a second logic circuit in the series. The output of the second logic circuit is coupled to the first input terminal of a third logic circuit in the series. Subsequent logic circuits in the series have alternately the first or second input terminal coupled to the output terminal of an immediately preceding logic circuit in the series. The circuit also includes a control circuit coupling the output terminals of the series logic circuits in the first delay circuit to corresponding input terminals of the series logic circuits in the second delay circuit.

21 Claims, 8 Drawing Sheets

CLOCK SKEW CIRCUIT

This application claims priority under 35 U.S.C. § 119 (e)(1) of provisional application No. 60/038,532, filed Feb. 28, 1997.

FIELD OF THE INVENTION

This invention generally relates to electronic circuits, and more specifically to integrated circuits.

BACKGROUND OF THE INVENTION

In electronic devices such as synchronous dynamic random access memory circuits (SDRAMs), microprocessors, digital signal processors, and so forth, the processing, storage, and retrieval of information is coordinated with a clock signal. The speed and stability of the clock signal determines to a large extent the data rate at which a circuit can function. A continual demand exists for devices with higher data rates; consequently, circuit designers have begun to focus on ways to increase the frequency of the clock signal. In SDRAMs, it is desirable to have the data output from the memory synchronized with the system clock that also serves the microprocessor. The delay between a rising edge of the system clock (external to the SDRAM) and the appearance of valid data at the output of the memory circuit is known as the clock access time of the memory. A goal of memory circuit designers is to minimize clock access time as well as to increase clock frequency.

One of the obstacles to reducing clock access time has been clock skew, that is, the delay time between the externally-supplied system clock signal and the signal that is routed to the memory's output circuitry. This skew in the clock signal internal to the integrated circuit is caused by the delays incurred in the signal passing through the clock input buffer and driver and through any associated resistive-capacitive circuit elements. One solution to the problem of clock skew is the use of a synchronous mirror delay as described by T. Saeki, et al. in "A 2.5-ns Clock Access, 250-MHz, 256-Mb SDRAM with Synchronous Mirror Delay," IEEE Journal of Solid-State Circuits, vol. 31, No. 11, November, 14, 1996, pp. 1656–1665, and also by T. Saeki, et al. in "A 2.5 ns Clock Access 250 MHz 256 Mb SDRAM with a Synchronous Mirror Delay," 1996 IEEE International Solid-State Circuits Conference, pp. 374–375. The synchronous mirror delay (SMD) is a digital circuit that consists of two delay circuit arrays and one control circuit. The SMD detects the clock cycle from two consecutive pulses, generates a clock-synchronized delay, and eliminates the clock skew, all within two clock cycles.

One problem with the synchronous mirror delay approach is that the delay circuit arrays used to measure and then eliminate clock skew are serially-coupled NAND gates and inverters. The output of one NAND gate drives the input of the next NAND gate (through the inverter). Indeed, the prior art SMD is configured such that the output of each NAND gate drives the same input of the successive NAND gate. In other words, the NAND gates have first and second inputs, and the output of the preceding NAND gate is always connected to the first input of the succeeding NAND gate, for example. Since the same input is driven throughout the chain of NAND gates, any asymmetry in the NAND gate is magnified when the signal reaches the end of the series. Thus, the propagation times of signals through the series logic may be different depending upon which input of the multiple input logic gates are cascaded. The difference in propagation time might be large enough that the signal pulse eventually disappears by over-running itself or by simply dissipating because not enough signal strength exists to keep it going. Aspects of the inventive concepts address these problems.

SUMMARY OF THE INVENTION

In accordance with a preferred embodiment of the invention, there is disclosed a clock circuit. The clock circuit includes a first delay circuit comprising an input terminal and a series of logic circuits, each of the logic circuits including an output terminal and first and second input terminals. The input terminal is coupled to the first input terminal of a first logic circuit in the series and the output of the first logic circuit is coupled to the second input terminal of a second logic circuit in the series. The output of the second logic circuit is coupled to the first input terminal of a third logic circuit in the series, and subsequent logic circuits in the series have alternately the first or second input terminal coupled to the output terminal of an immediately preceding logic circuit in the series.

The circuit also includes a second delay circuit comprising an output terminal and a series of logic circuits, each of the logic circuits including an output terminal and first and second input terminals. The output terminal of the first logic circuit in the series is coupled to the second input terminal of a second logic circuit in the series. The output of the second logic circuit is coupled to the first input terminal of a third logic circuit in the series. Subsequent logic circuits in the series have alternately the first or second input terminal coupled to the output terminal of an immediately preceding logic circuit in the series. The circuit also includes a control circuit coupling the output terminals of the series logic circuits in the first delay circuit to corresponding input terminals of the series logic circuits in the second delay circuit. In one embodiment the series logic circuits comprise series-coupled NAND gates.

An advantage of the inventive concept is that it provides a solution to operational asymmetries in multiple-input logic elements used serially to form a delay circuit.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1:
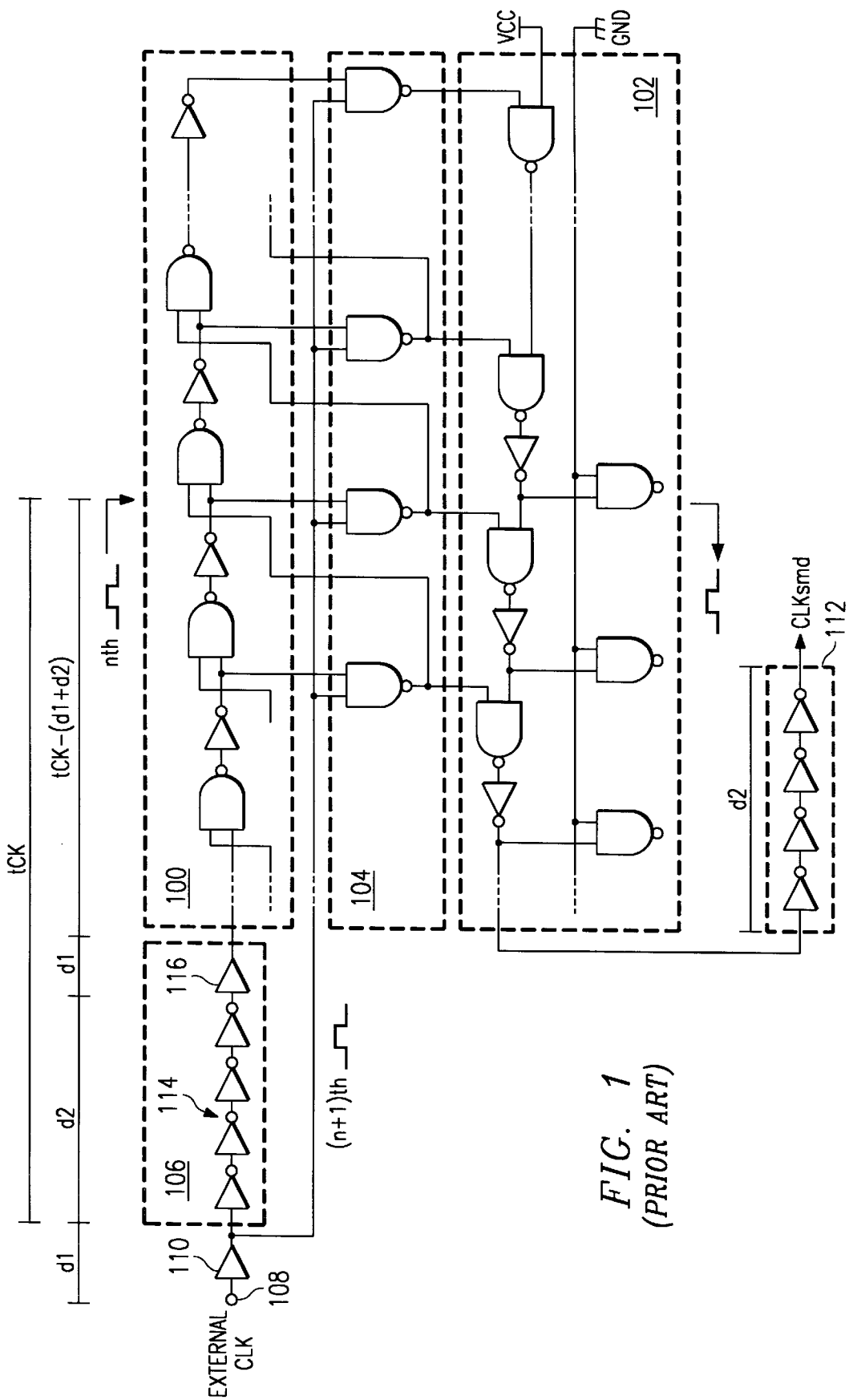
FIG. 1 is a schematic diagram of a prior art synchronous mirror delay circuit.

FIG. 1 is a schematic diagram of a prior art clock deskewing circuit known as a synchronous mirror delay for use in an integrated circuit such as a synchronous dynamic random access memory. It comprises a forward delay array (FDA) 100, a backward delay array (BDA) 102, a mirror control circuit (MCC) 104, and a delay monitor circuit (DMC) 106. An external clock signal is presented at the external clock terminal 108, which is connected to an input buffer 110. Clock driver 112 amplifies the clock signal from the BDA 102 to facilitate distributing the deskewed signal, CLKsmd, to the integrated circuit.

Figure 2:
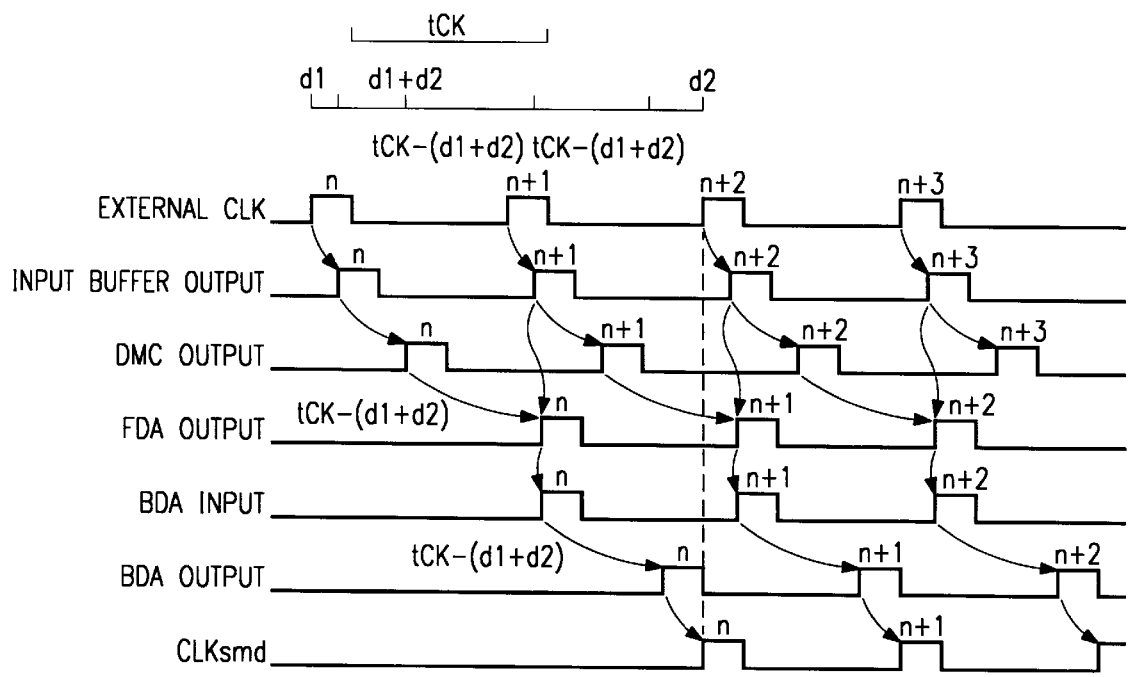
FIG. 2 is a prior art timing diagram of the circuit of FIG. 1.

The operation of the SMD is as follows. After an nth clock pulse passes through the input buffer 110, the DMC 106, and into the FDA 100, the (n+1)th clock pulse enters the MCC 104. The entry of the (n+1)th pulse into the MCC 104 transfers the nth pulse to the BDA 102. Outputs from the MCC are fed forward in the FDA as the pulse is transferred to the BDA to terminate the progression of the nth pulse to the remainder of the FDA. Once transferred to the MCC, the nth pulse then travels back through the BDA the distance that it had traveled through the FDA prior to the transfer. The delay incurred in passing through the input buffer is denoted $d_1$, while the delay through the clock driver is $d_2$. Note that the DMC 106 comprises buffer 116 and driver 114 circuits to emulate the delay through input buffer 110 and clock driver 112. The time the pulse spends in the FDA is the clock cycle, tCK, less the delay through the input buffer 110 ($d_1$) and the clock driver 112 ($d_2$). Therefore, when the nth pulse reaches the output of the BDA prior to entering the clock driver 112, it is advanced in time by $d_2$ compared to the (n+2)th pulse just entering at terminal 108. The clock signal CLKsmd at the output of clock driver 112 is therefore aligned with the (n+2)th pulse, thus meaning that clock skew has been eliminated. FIG. 2 is a timing diagram showing the elimination of the skew. If despite efforts at emulating all of the delay elements in the delay monitor circuit 106, the signal CLKsmd does not align with the (n+2)th pulse, the delay $d_2$ of the clock driver 112 can be adjusted so that the signals do align. This adjustment may be accomplished by adding or removing inverter stages in the clock driver 112, for example, by including metal layer options or fuses in the circuit layout design.

While the SMD circuit shown in FIG. 1 offers quick clock access time, that is, a deskewed clock signal within two clock cycles, it is capable of a maximum frequency of operation of only about 300 MHz. This is because the speed of the SMD is essentially limited to the rate at which a signal pulse can travel the loop formed by the DMC 106, the FDA 100, and the BDA 102. The fastest that a pulse can travel this loop is approximately 3 ns, which corresponds to a frequency of about 300 MHz.

Figure 3:
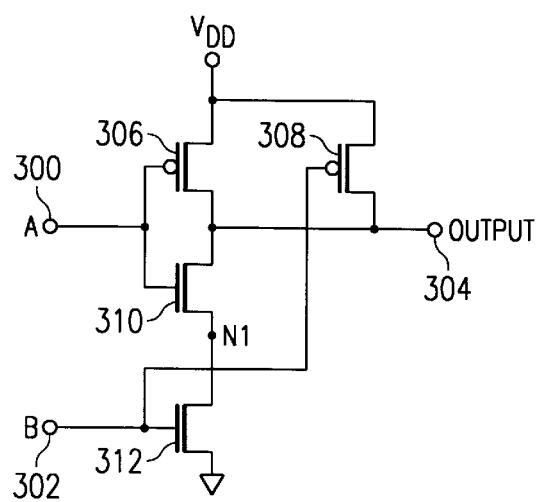
FIG. 3 is a schematic diagram of a prior art NAND gate.

FIG. 3 is a schematic diagram of a prior art NAND gate that includes input terminals A (300) and B (302) and an output terminal 304. For logic low input signals at the A input terminal 300 or the B input terminal 302, either p-channel transistor 306 or p-channel transistor 308 is in a conductive state, thus pulling the output terminal 304 to the supply voltage, VDD, to produce a logic high output voltage. In contrast, when logic high signals are presented to both the A input terminal and the B input terminal, n-channel transistor 310 and n-channel transistor 312 are conductive, and a capacitive load such as a bus connected to output terminal 304 is discharged through transistors 310 and 312 to electrical ground to produce a logic low output voltage.

A problem arises when the circuit of FIG. 3 is serially-connected as it is in the circuit of FIG. 1. In particular, in most situations, one of the A or B inputs is already at a logic high when a logic high voltage is presented to the other input. For example, in a first situation terminal A may be at a logic high voltage when a signal transitioning from a logic low to a logic high is presented to terminal B. In this situation, even though transistor 310 was made conductive by the logic high signal, charge at the output terminal as well as node N1 was prevented from discharging because transistor 312 is non-conductive until the signal at node B transitions to a logic high voltage. In contrast, in a second situation where terminal B is a logic high and then a signal at terminal A transitions to a logic high voltage, a different amount of charge is transferred to electrical ground through transistors 310 and 312 than in the situation where terminal A was held at a logic high prior to B transitioning to logic high. Specifically, when terminal B is at a logic high voltage, node N1 discharges to electrical ground even though terminal A is still at a logic low voltage. So, when terminal A goes to a logic high the total amount of charge transferred to electrical ground is only the charge at the output terminal 304 less the charge originally stored at node N1. Since discharging the smaller charge in the second situation takes less time than the discharge event in the first situation, an asymmetry exists in the operation of the NAND gate. In other words, one of the inputs is a fast input terminal and the other is a slow input terminal.

Serial connections of NAND gates in which the output of the previous NAND gate is invariably connected to the same input terminal (either the fast terminal or the slow terminal) of the following NAND gate enhance the asymmetry described above. Indeed, a signal proceeding through serial NAND gates in which the fast input is predominantly used can over-run a signal proceeding through the serially-connected slow inputs or through other logic circuitry. One result is that an input clock pulse to the first stage of a delay path may not propagate through the entire delay if the delay path is excessively long.

Other sources of asymmetry in logic gates include transistor variability resulting from the fabrication process and fluctuations in supply voltages. It is typical that the performance characteristics of n-type and p-type transistors in a process are not the same, due primarily to the disparity in the mobilities of holes and electrons in most semiconductors. Thus, the use of a multiple-input logic circuit such as a NAND gate introduces asymmetry. Traditionally, designers have simply adjusted the gate widths of the p and n transistors to obtain symmetrical input/output characteristics for a logic circuit that suffers from operational asymmetry. This approach of adjusting the characteristics of individual transistors, however, is not only tedious, but often conflicts with the competing goal of optimizing system performance.

Figure 4:
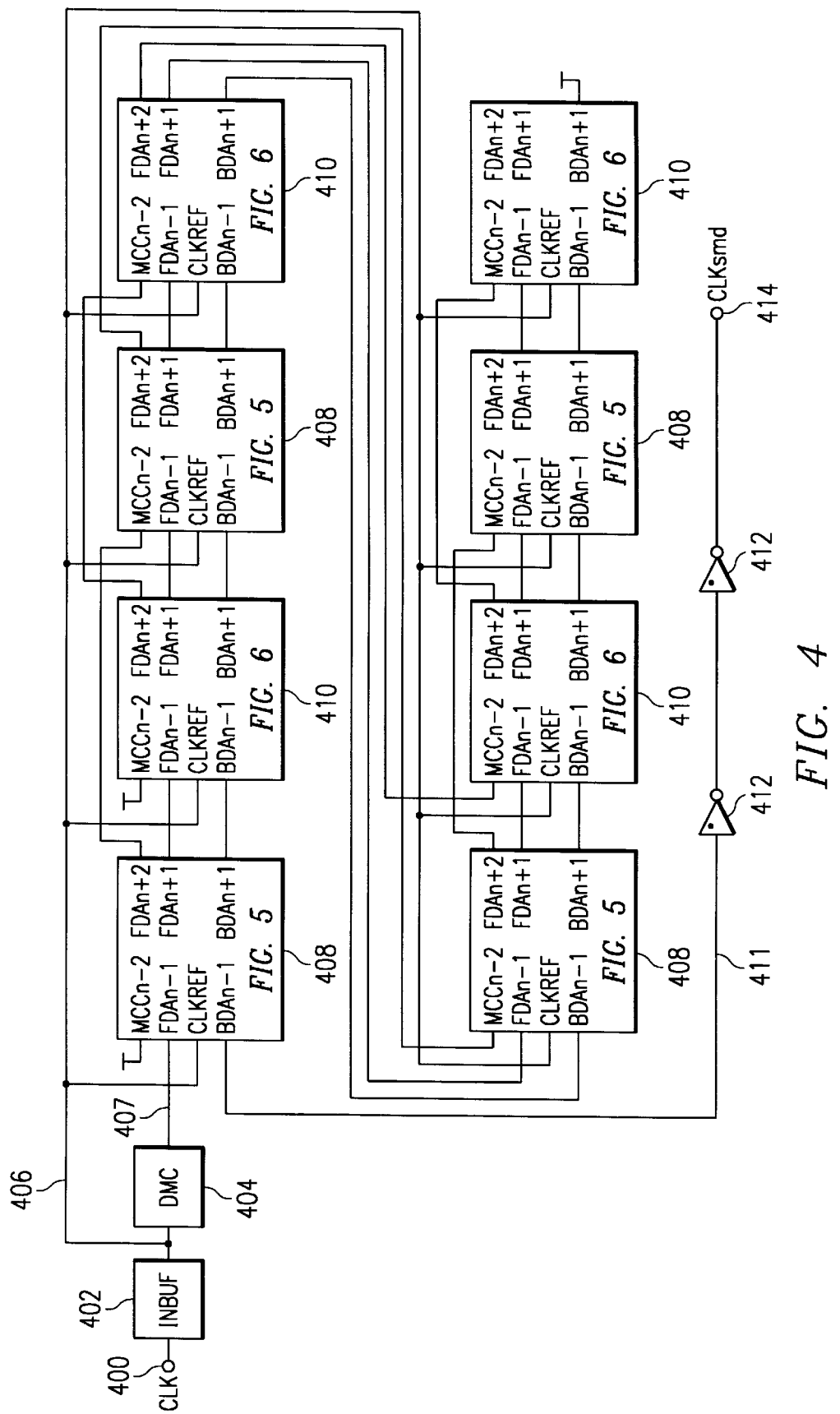
FIG. 4 is a block diagram of a circuit in accordance with a first preferred embodiment of the invention.

A first preferred embodiment of the invention is shown in FIG. 4. The circuit of FIG. 4 is functionally similar to that of the circuit of FIG. 1. An external clock signal enters the circuit at terminal 400 and is buffered by input buffer 402. The output of the input buffer is then taken to delay monitor circuit 404. The output of the input buffer is also diverted along line 406 to serve as the external clock reference that governs the transfer of the pith pulse from the forward delay array into the monitor control circuit and then into the backward delay array. The output of the DMC on line 407 is also the input to the FDA. The FDA, MCC, and BDA are made up of the delay units 408 and 410. The output of the BDA is taken along line 411 to buffer drivers 412 and to the output of the SMD at terminal 414. The clock signal at terminal 414 is deskewed relative to the external clock signal originally input at terminal 400.

Figure 5:
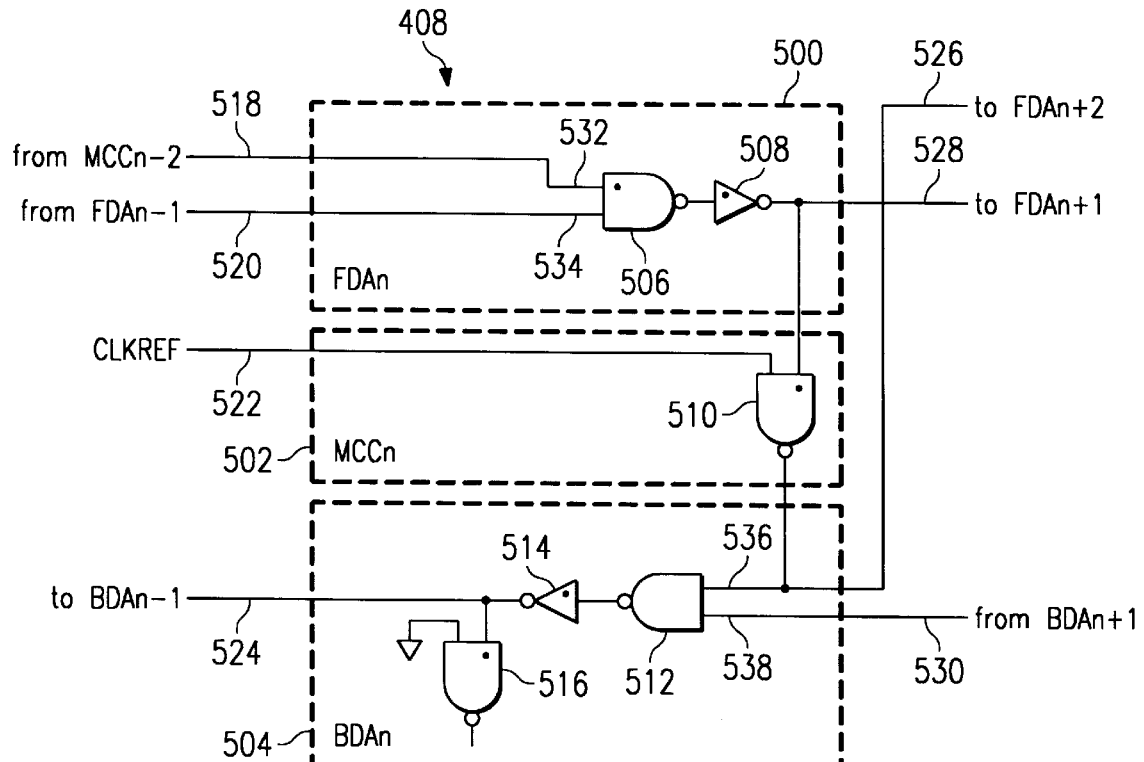
FIG. 5 is a schematic diagram of a delay unit corresponding to element 408 in FIG. 4.

FIG. 5 is a schematic diagram of the delay unit 408 in the circuit of FIG. 4. The nth units of the FDA, the MCC, and the BDA are shown as elements 500, 502, and 504, respectively. The synchronous mirror delay circuit of FIG. 4 may comprise as many as one hundred or more of the delay units 408 and 410 (depending upon the length of the clock cycle for which the circuit is designed), which form the FDA, MCC, and BDA. The delay unit includes one of the NAND gate 506 and inverter 508 pairs that form the serially-connected FDA; one of the NAND gates 510 that transfer the propagating clock pulse from the FDA to the BDA; and one of the NAND gate 512, inverter 514, NAND gate 516 connections that form the BDA. NAND gate 516 does not contribute functionally to the circuit, but serves to match the loading characteristics of inverter 514 in the BDA to those of inverter 508 in the FDA. Line 518 is coupled to the output of the MCC block of the unit that occurs two places before (n−2) the 1th units 408 (see line 526 of FIG. 5). If the nth unit is the first or second unit in the series, line 518 is coupled to supply voltage VDD. Line 520 is coupled to the output of the FDA of the previous delay unit in the series (see line 628 of FIG. 6). Line 522 is coupled to the buffered external clock signal. Line 524 is the output of the BDA block of the nth delay unit and is coupled to the input of the BDA block of the (n−1)th block in the series (see line 630 of FIG. 6). Line 526 is coupled to the first or A input terminal of the NAND gate in the FDA block of the (n+2)th delay unit (see line 518 of FIG. 5). The first or A input terminal of the NAND gate in the nth FDA block is labeled 532, while the second or B input terminal is labeled 534. Line 528 is coupled to the first or A input of the NAND gate in the FDA block of the next delay block in the series (see line 620 of FIG. 6). Line 530 is coupled to the output of the BDA block of the next delay block in the series (see line 624 of FIG. 6).

Figure 6:
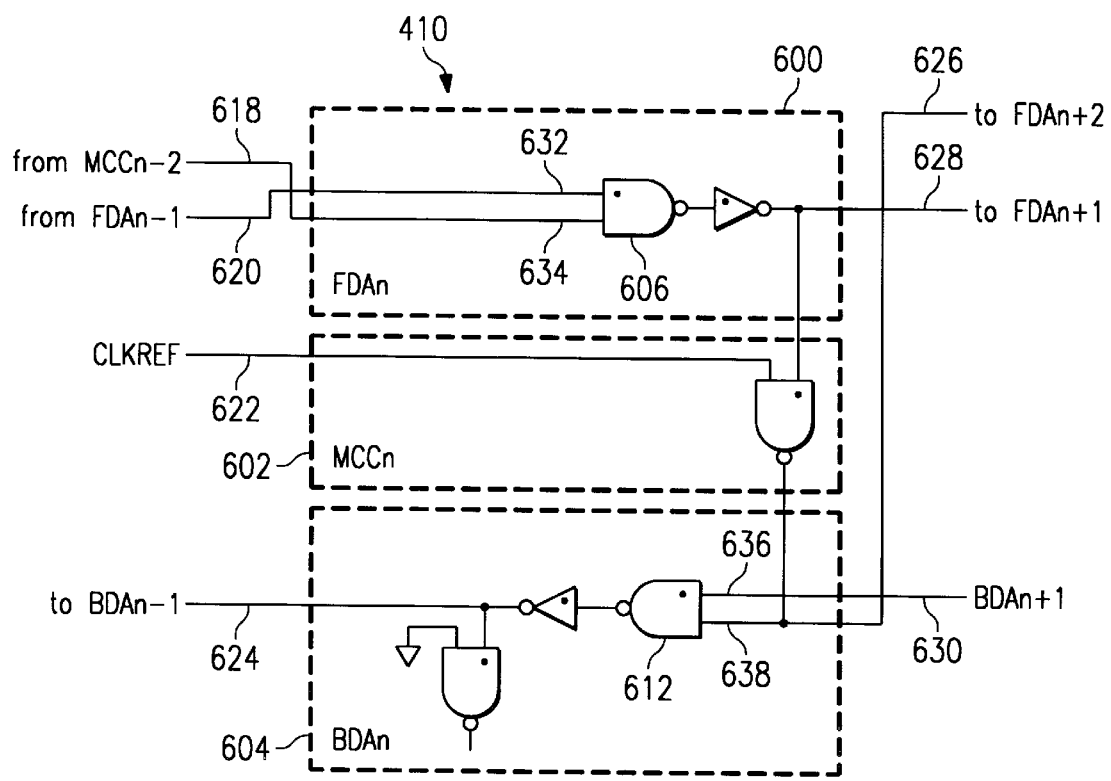
FIG. 6 is a schematic diagram of a delay unit corresponding to element 410 in FIG. 4.

FIG. 6 is a schematic diagram of the delay unit 410 in the circuit of FIG. 4. It is similar to the circuit of FIG. 5, except that the inputs to the NAND gates 606 and 612 in the FDA and BDA blocks are switched relative to the corresponding NAND gates 506 and 512 in the circuit of FIG. 5. In other words, line 618 is coupled to the second or B input 634 of NAND gate 606 and line 620 is coupled to the first or A input 632 of the same NAND gate. In contrast, in FIG. 5 line 518 is coupled to the first input 532 of NAND gate 506 and line 520 is coupled to the second input 534 of the same NAND gate. The connections to NAND gate 612 are similarly switched relative to the connections to NAND gate 512 in FIG. 5. In the following description of FIG. 6, reference to the nth units means the FDA 600, MCC 602, and BDA 604 of FIG. 6. Line 618 is coupled to the output of the MCC block of the unit that occurs two places before (n−2) the nth units 410 (see line 626 of FIG. 6). If the nth unit is the first or second unit in the series, line 618 is coupled to supply voltage VDD. Line 620 is coupled to the output of the FDA of the previous delay unit in the series (see line 528 of FIG. 5). Line 622 is coupled to the buffered external clock signal. Line 624 is the output of the BDA block of the nth delay unit and is coupled to the input of the BDA block of the (n−1)th block in the series (see line 530 in FIG. 5). Line 626 is coupled to the second or B input terminal of the NAND gate in the FDA block of the (n+2)th delay unit (see line 618 of FIG. 6). Line 628 is coupled to the second or B input of the NAND gate in the FDA block of the next delay block in the series (see line 520 of FIG. 5). Line 630 is coupled to the output of the BDA block of the next delay block in the series (see line 524 of FIG. 5).

Thus, in the series of delay units in the synchronous mirror delay circuit of FIG. 4, each output of a NAND gate in the FDA and BDA blocks of the delay units in the series is coupled to either the first or second input of the following NAND gate in the series, and the output of that NAND gate is then coupled to the opposite either first or second input of the following NAND gate in the series. For example, in FIG. 4 the first delay unit 408 in the series is the delay unit shown schematically in FIG. 5. Therefore, the input to the FDA of that unit on line 407 is coupled to the second input 534 of NAND gate 506. The second delay unit in the series, however, is the delay unit shown schematically in FIG. 6. Thus, the output of the FDA from the first delay unit 408 is connected to the first input terminal 632 of the NAND gate 606. In this way, a clock pulse propagating through the FDA or BDA circuits alternately encounters fast and slow NAND gate inputs, thus avoiding the problem described above of over-run or degraded clock signals.

Although series-coupled NAND gates and inverters form the FDA and BDA of the embodiment circuit, simpler delay elements such as resistors or metal lines could also be used, as could more complex logic gate delay circuits. In addition, one skilled in the art will appreciate that logic circuits other than NAND gates and inverters could be used as elements of the delay units. For example, a NOR gate with inverters at the inputs would be functionally similar to a NAND gate with an inverter at the output. The most efficient logic implementation of the delay circuits may also vary depending upon the technology in which the circuit is implemented (CMOS, bipolar, or similar transistor technology).

Figure 7A:
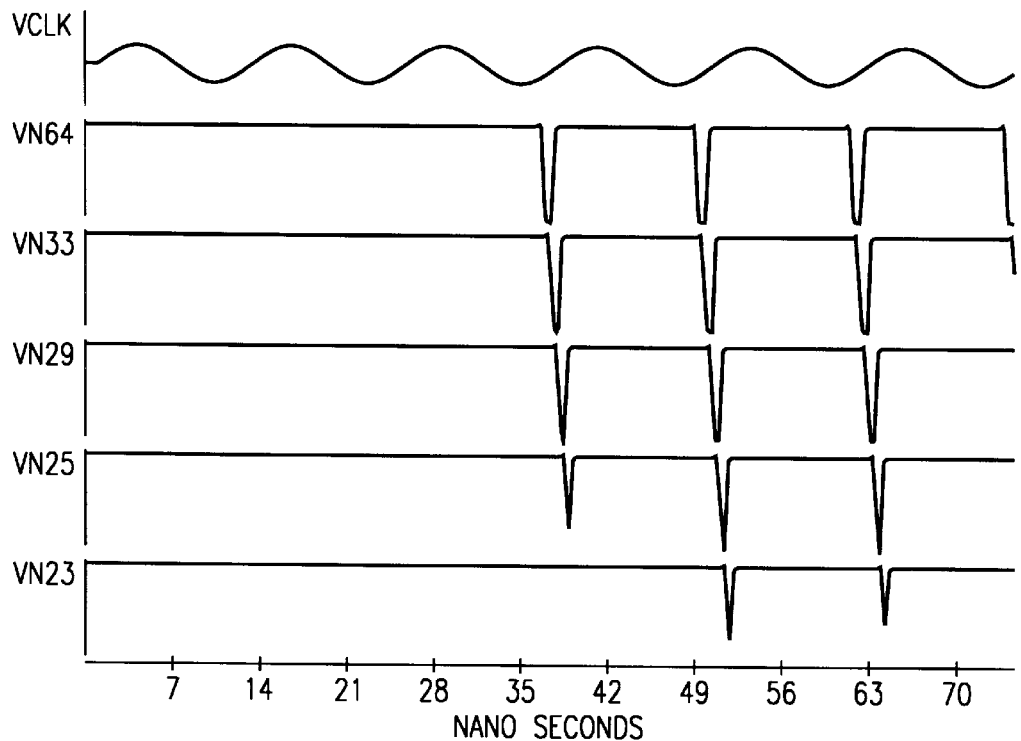
FIG. 7a is a diagram of pulse progression through a prior art circuit.
Figure 7B:
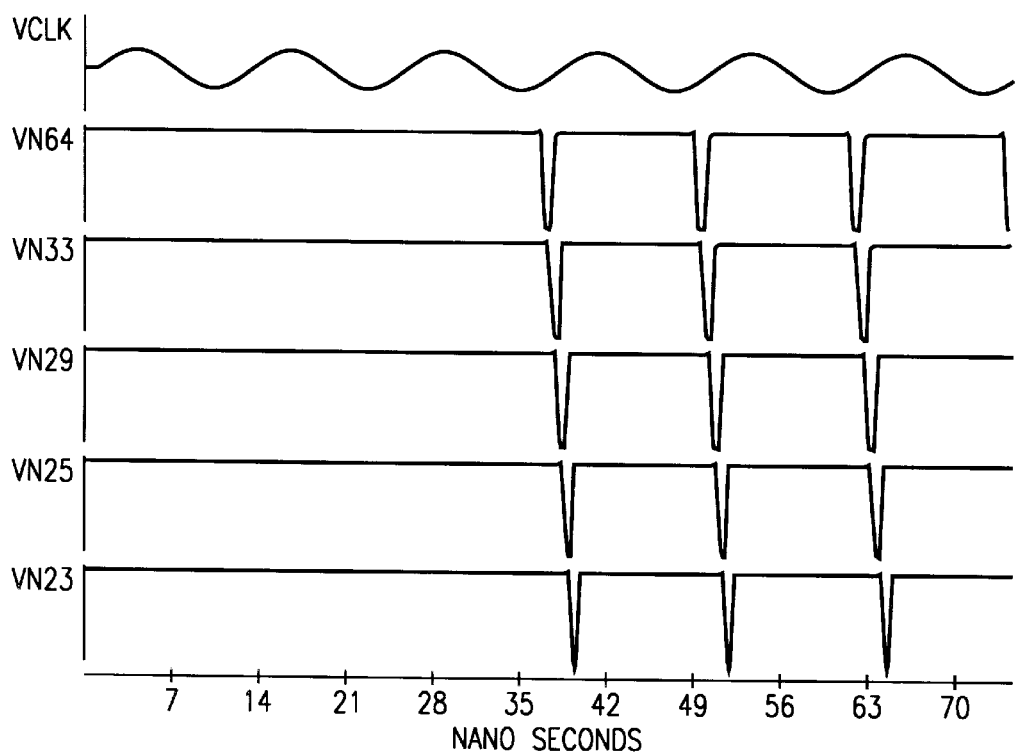
FIG. 7b is a diagram of pulse progression through an embodiment circuit.

FIG. 7a shows the progression of a clock pulse through stages of a prior art synchronous mirror delay in which the same NAND gate input is used throughout. The line labeled "VCLK" shows the external clock signal, while the lines labeled "VN64," "VN33," and so forth show the clock pulse at delay units within the delay circuit. By the time the first clock pulse reaches unit VN23, the signal has disappeared, while the second and third pulses also show degradation. In contrast, FIG. 7b shows the progression of a clock pulse through stages of an embodiment synchronous mirror delay circuit. The use of alternating inputs to the logic circuitry in the series results in comparatively strong clock pulses at delay unit VN23.

Figure 8:
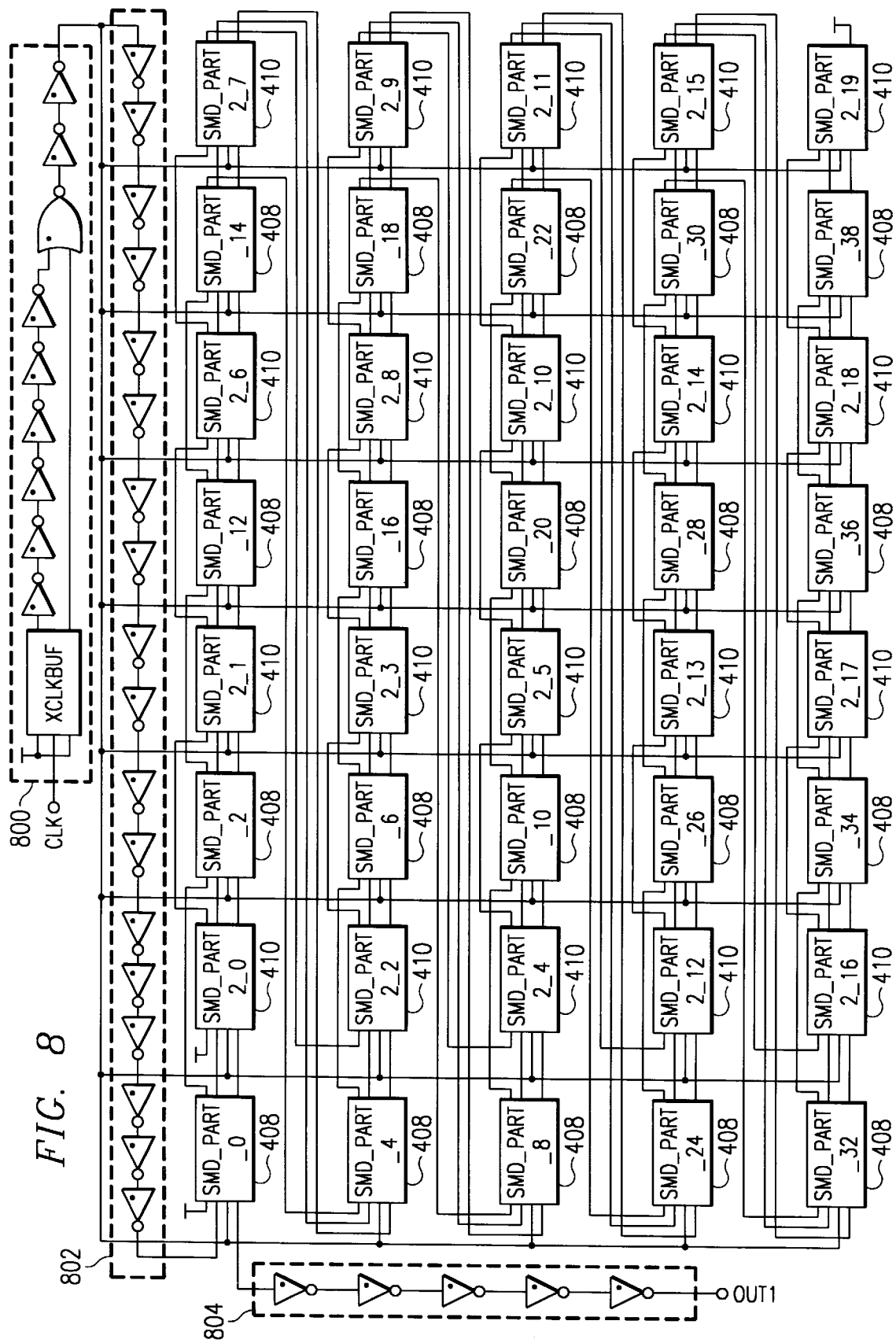
FIG. 8 is a block diagram of a circuit in accordance with a second preferred embodiment of the invention.

FIG. 8 is a second preferred embodiment of the invention. As in the circuit of FIG. 4, the circuit of FIG. 8 comprises a buffer circuit 800, a delay monitor control circuit 802, and a clock driver circuit 804. The circuit of FIG. 8 also comprises many more delay unit stages than does the circuit of FIG. 4.

Figure 9:
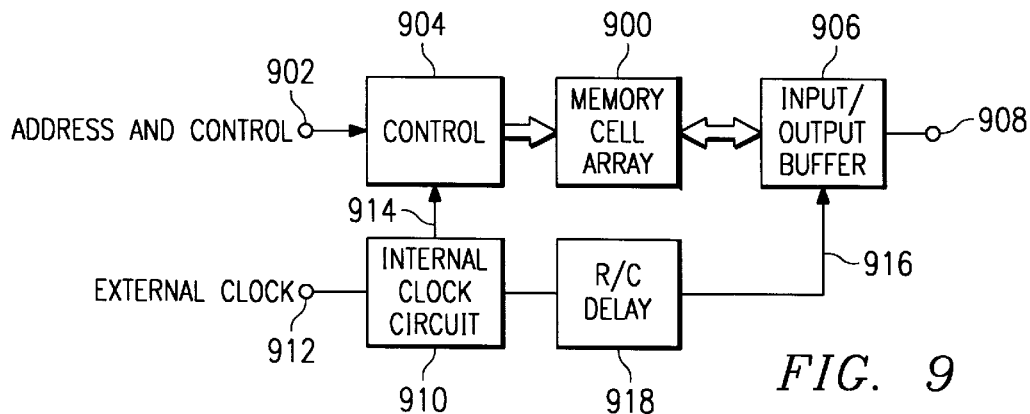
FIG. 9 is a block diagram of a third preferred embodiment memory circuit, which may incorporate the circuits of FIGS. 4 and 8.

FIG. 9 is a block diagram of a third preferred embodiment that may incorporate an internal clock circuit such as that described in the first and second preferred embodiments. The circuit of FIG. 9 represents an SDRAM having at its core the memory cell array 900. Address and control inputs are made at input terminal 902 and are processed by control circuit block 904. Data to be written into or read out of the memory cell array 900 passes through a data transfer circuit, which in FIG. 9 is the input/output buffer circuit block 906. Data appears at output terminal 908 either in preparation to be transferred into the memory cell array in a write operation or after data has been retrieved from the memory cell array during a read operation. Internal clock circuit 910 buffers and deskews the external clock signal presented at terminal 912. It may be desirable to use the deskewed clock signal for only certain operations in the circuit, to save power for example. For operations within the memory circuit that do not require a deskewed clock signal, shown in FIG. 9 as the decoding of addresses and retrieval of data from the memory cell array for example, a merely buffered and amplified version of the external clock is made available on line 914.

The deskewed clock signal provided by internal clock circuit 910 is used for operations in which synchronization with the external clock signal is desirable. For example, in FIG. 9 the output buffer circuit is controlled by the deskewed signal on line 916 to ensure that the data is output at terminal 908 with a minimum of clock access time. During data output modes, each successive clock pulse on line 916 enables a gate in the output buffer circuit block 906 that allows data to pass through the output buffer to the terminal 908. In contrast, the address and control operations performed by control block 904 are clocked by the merely buffered clock signal on line 914. Using the deskewed signal only for the control of output operations allows the internal clock circuit 910 to be deactivated during other operations to conserve power, for example.

The R/C delay block 918 represents delay caused by line lengths, for example, between the internal clock circuit 910 and the output buffer 906. The SMD in the circuit of FIGS. 4 and 8 can be modified to correct for the skew induced by this delay, or by similar delays, by adding a comparable delay element in the delay monitor circuit block of the SMD. The delay monitor circuit block is described as element 106 in the circuit of FIG. 1.

In SDRAM circuits, information such as row and column addresses and row and column enable signals typically enter the memory circuit by being held at the input of a buffer until the buffer is enabled with a clock signal, or they are passed through the buffer and stored on the rising edge of a clock signal in a latch. In either case, the set-up and hold time of the address or row or column enable signal supplied by an external source such as a microprocessor is dependent upon the skew between the externally-supplied system clock and the clock that is internal to the memory circuit. The address and enable data is supplied by a source that is synchronized by the external or system clock, while the clock signal that enables the input buffer or the latch is the internal clock signal. Therefore, the set-up and hold time of the address and row or column enable signals must extend long enough to cover the skew between the clock signals to ensure that the data is passed through the buffer or latched as desired.

Figure 10:
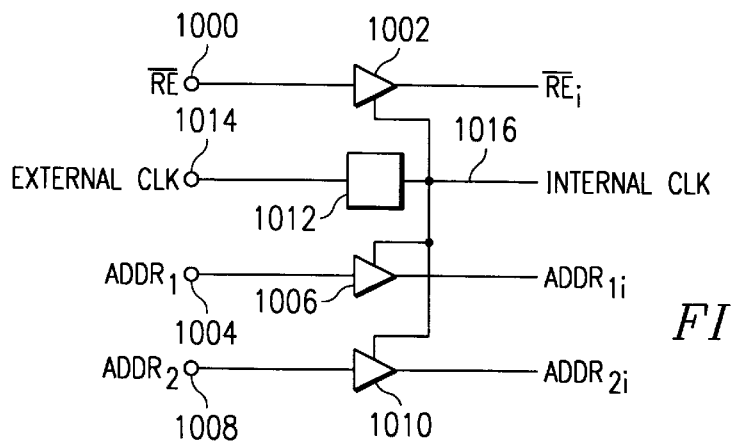
FIG. 10 is a schematic diagram of a fourth preferred embodiment input circuit.

The foregoing may be better understood by referring to a fourth preferred embodiment of the invention shown in FIG. 10. FIG. 10 is a simplified schematic diagram showing the input circuitry of an SDRAM. The circuit comprises a row enable input terminal 1000 coupled to a row enable buffer 1002; a first address terminal 1004 and a first address buffer 1006; and a second address terminal 1008 and a second address buffer 1010. The circuit also includes a clock deskews circuit 1012 coupled to external clock terminal 1014. The clock deskew circuit 1012 includes the first preferred embodiment circuit shown in FIG. 4, for example. The deskew circuit 1012 could alternatively include the second preferred embodiment shown in FIG. 8, a phase-lock loop, delay-lock loop, or similar circuit. In this embodiment, data is held on terminals 1000, 1004, and 1008 until buffers 1002, 1006, and 1010 are enabled by a clock pulse on line 1016.

Figure 11A:
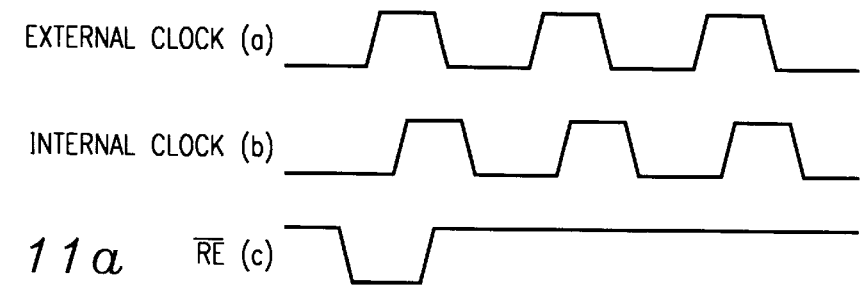
FIG. 11a is a timing diagram showing the effects of clock skew on control input signals for a memory circuit.
Figure 11B:
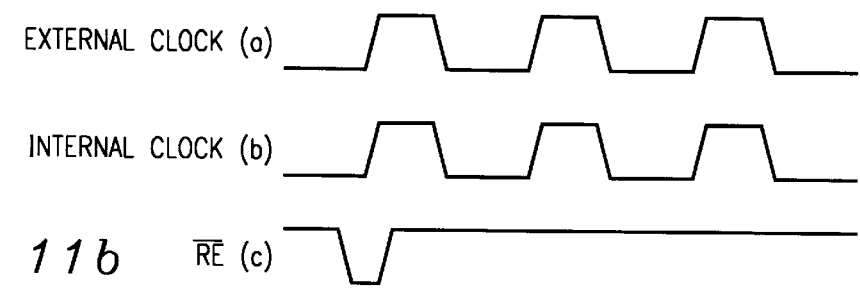
FIG. 11b is a timing diagram showing the benefits of using a deskewed clock signal for the entry of control, address, and data signals to a memory circuit.

Whereas in the embodiment shown in FIG. 9, the deskewed clock signal was used only in the output circuits of the memory device, the circuit of FIG. 10 uses a deskewed internal clock signal for the inputting of control and address signals. Using the deskewed signal to control more functions in the memory circuit might require that the deskew circuit remain active longer and consume more energy than if the deskewed signal is used selectively to control only the outputting of data, for example. But an advantage gained by using a deskewed internal clock signal to enable buffers 1002, 1006, and 1010 may be seen by comparing the timing diagrams of FIG. 11a and 11b. In FIG. 11a, the clock deskew circuit 1012 in FIG. 10 is replaced with a simple buffer. Hence a delay or skew exists between the external clock signal in line (a) of FIG. 11a and the internal clock signal in line (b) of FIG. 11a. As a result of this skew, the row enable signal shown in line (c) for example, should be held low long enough to cover the rising edge of the internal clock signal. Indeed, the set-up and hold time may be long enough to occupy so much of the clock cycle as to prevent the use of a higher-frequency clock. In contrast, in the circuit of FIG. 10 where the clock deskew circuit is used, the internal clock (line (b)) is temporally aligned with the external clock (line (a)) as shown in FIG. 11b. Therefore, the set-up and hold time of the row enable signal (line (c)) can be made much shorter. This shorter set-up and hold time also facilitates the use of a faster clock signal if desired.

Figure 12:
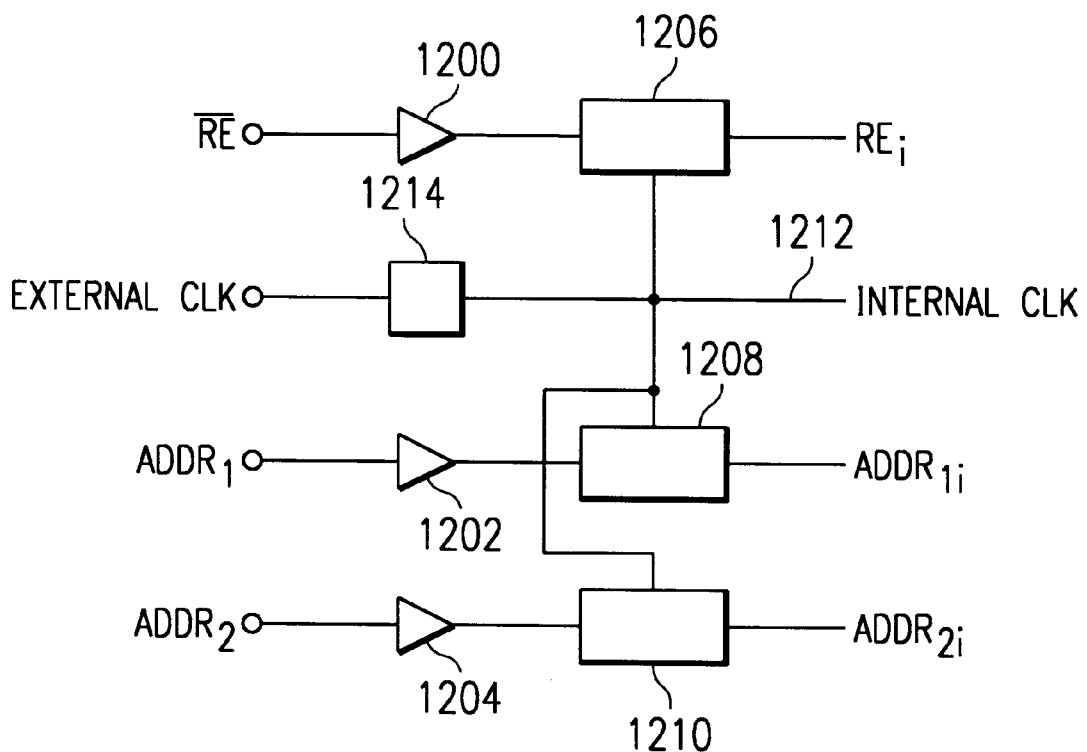
FIG. 12 is a schematic diagram of a fifth preferred embodiment input circuit.

A fifth preferred embodiment shown in FIG. 12 is similar to the embodiment shown in FIG. 10, but data passes through buffers 1200, 1202, and 1204 and is stored in latches 1206, 1208, and 1210 in response to an edge of the internal clock signal on line 1212. The advantages described above that are gained by deskewing the internal clock signal with deskew circuit 1214 apply to the circuit of FIG. 12 as well.

Figure 13:
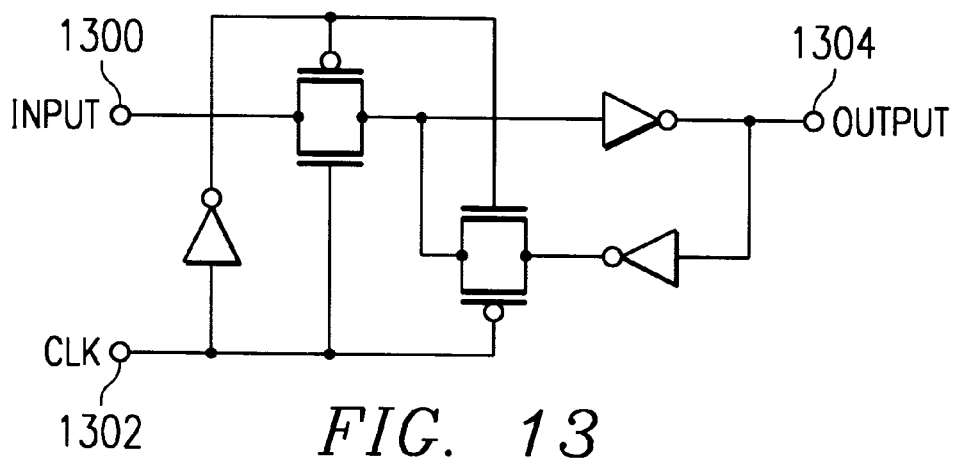
FIG. 13 is a latch circuit as may be used in the circuit of FIG. 12.

FIG. 13 is a latch circuit as may be used for the latches 1206, 1208, and 1210. The circuit stores the data appearing at the input terminal 1300 in conjunction with a high-going clock pulse at clock terminal 1302. That is, when the clock signal at terminal 1302 goes to a logic high, the complement of the data at input terminal 1300 appears at output terminal 1304. When the clock signal at terminal 1302 goes low, the data at output terminal 1304 remains unchanged (i.e. it is stored for the logic low portion of the clock cycle). On the next high-going clock cycle the complement of the data at input terminal 1300 then appears on the output terminal 1304 as before.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, where logic circuitry in the embodiments was described in terms of normal logic, one skilled in the art will appreciate that the circuits could have been implemented in reverse logic as well. In addition, the embodiments discussed herein were implemented in CMOS logic. The skilled artisan will appreciate that the circuits may be implemented in non-complementary MOS logic as well as with bipolar logic. It is therefore intended that the appended claims encompass any such modifications or embodiments.

What is claimed is:

1. A clock circuit, comprising:

a plurality of logic circuits, each logic circuit having an output terminal, a supply terminal, and first and second input terminals, each logic circuit including a first transistor and a second transistor, each of the first and second transistors having current paths connected in series, the current path of the first transistor coupled to the output terminal, the current path of the second transistor coupled to the supply terminal, the first transistor having a control terminal coupled to the first input terminal, the second transistor having a control terminal coupled to the second input terminal;

a first delay circuit comprising a first plurality of the logic circuits connected in series, wherein the respective output terminals of the first plurality are alternately connected to one of the first and second input terminals of the first plurality;

a second delay circuit comprising a second plurality of the logic circuits connected in series, wherein the respective output terminals of the second plurality are alternately connected to one of the first and second input terminals of the second plurality; and a control circuit having plural output terminals coupled to respective other of the first and second input terminals of the first and the second plurality.

2. The circuit of claim 1, wherein each logic circuit comprises a NAND gate.

3. The circuit of claim 1, wherein each logic circuit comprises a NOR gate.

4. The circuit of claim 1, further comprising:

a buffer circuit and a delay monitor control circuit coupled to the first plurality of logic circuits; and a clock driver circuit coupled to the second plurality of logic circuits.

5. The circuit of claim 4, wherein said delay monitor control circuit includes a replication of said buffer and clock driver circuits.

6. A circuit as in claim 1, wherein the first delay circuit is a forward delay circuit and wherein the second delay circuit is a backward delay circuit.

7. A circuit as in claim 1, further comprising:

a memory control circuit coupled to receive address and control signals;

a memory array circuit coupled to the memory control circuit; and a data output circuit coupled to the memory array circuit and to the clock circuit.

8. A circuit as in claim 7, wherein the clock circuit is coupled to receive an external clock signal and wherein the clock applies an internal clock signal to the data output circuit.

9. A circuit as in claim 1, further comprising a plurality of address circuits, each address circuit coupled to receive a respective external address signal and coupled to the clock circuit, each address circuit arranged to operate in synchronization with an internal clock signal from the clock circuit.

10. A circuit as in claim 9, wherein each address circuit further comprises a latch circuit arranged to store the external address signal in synchronization with the internal clock signal.

11. A clock circuit, comprising:

a plurality of delay elements, each delay element having an output terminal, a first input terminal and a second terminal, each delay element having a different delay from the first input terminal to the respective output terminal than from the second input terminal to the respective output terminal;

a first delay circuit including a first plurality of the delay elements connected in series, wherein the respective output terminals of the first plurality are alternately connected to one of the first and second input terminals of the first plurality; and a control circuit having plural output terminals respectively coupled to another of the first and second input terminals of the first plurality.

12. A circuit as in claim 11, further comprising a second delay circuit including a second plurality of the delay elements connected in series, wherein the respective output terminals of the second plurality are alternately connected to one of the first and second input terminals of the second plurality and wherein respective output terminals of the control circuit are connected to another of the first and second input terminals of the second plurality.

13. A circuit as in claim 11, wherein each delay element comprises a NAND gate.

14. A circuit as in claim 13, wherein each delay element further comprises an INVERTER connected between the NAND gate and the respective output terminal.

15. A circuit as in claim 11, wherein each delay element comprises a NOR gate.

16. A circuit as in claim 12, further comprising:

a buffer circuit coupled to receive an external clock signal;

a delay monitor control circuit coupled between the buffer circuit and the first plurality; and a clock driver circuit coupled to the second plurality.

17. A circuit as in claim 16, wherein the delay monitor control circuit includes a replication of the buffer circuit and the clock driver circuit.

18. A circuit as in claim 12, wherein the first delay circuit is a forward delay circuit and wherein the second delay circuit is a backward delay circuit.

19. A circuit as in claim 12, further comprising:

a memory control circuit coupled to receive address and control signals;

a memory array circuit coupled to the memory control circuit; and a data output circuit coupled to the memory array circuit and to the clock circuit.

20. A circuit as in claim 12, further comprising a plurality of address circuits, each address circuit coupled to receive a respective external address signal and coupled to the clock circuit, each address circuit arranged to operate in synchronization with an internal clock signal from the clock circuit.

21. A circuit as in claim 9, wherein each address circuit further comprises a latch circuit arranged to store the external address signal in synchronization with the internal clock signal.

* * * * *